United States Patent
Hashimoto et al.

(10) Patent No.: US 8,237,493 B2
(45) Date of Patent: Aug. 7, 2012

(54) SEMICONDUCTOR DEVICE AND POWER SUPPLY DEVICE USING THE SAME

(75) Inventors: Takayuki Hashimoto, Tokai (JP);
Nobuyoshi Matsuura, Takasaki (JP);
Masaki Shiraishi, Hitachinaka (JP);
Yukihiro Satou, Takasaki (JP); Tetsuya Kawashima, Hitachi (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/243,642

(22) Filed: Sep. 23, 2011

(65) Prior Publication Data

US 2012/0014155 A1    Jan. 19, 2012

Related U.S. Application Data

(63) Continuation of application No. 12/851,849, filed on Aug. 6, 2010, now Pat. No. 8,067,979, which is a continuation of application No. 12/349,106, filed on Jan. 6, 2009, now Pat. No. 7,782,025, which is a continuation of application No. 11/585,226, filed on Oct. 24, 2006, now Pat. No. 7,480,163.

(30) Foreign Application Priority Data

Oct. 24, 2005   (JP) .................................. 2005-307999

(51) Int. Cl.
*H01L 25/00* (2006.01)
(52) U.S. Cl. ...................................... 327/566; 327/541
(58) Field of Classification Search ................... 323/283, 323/355, 224; 327/566, 541
See application file for complete search history.

(56) References Cited

U.S. PATENT DOCUMENTS

| | | | |
|---|---|---|---|
| 4,942,312 A | 7/1990 | Stevens | |
| 6,545,890 B2 | 4/2003 | Pitzele | |
| 6,580,597 B2 | 6/2003 | Kanouda et al. | |
| 6,756,658 B1 | 6/2004 | Gillett et al. | |
| 6,940,189 B2 | 9/2005 | Gizara | |
| 7,119,399 B2 * | 10/2006 | Ma et al. | 257/341 |
| 7,480,163 B2 | 1/2009 | Hashimoto et al. | |
| 2002/0179945 A1 | 12/2002 | Sakamoto et al. | |

FOREIGN PATENT DOCUMENTS

| | | |
|---|---|---|
| JP | 2002-368121 | 12/2002 |
| JP | 2004-342735 | 12/2004 |
| JP | 2006-277014 | 10/2005 |

OTHER PUBLICATIONS

Y. Takezawa, et al., "New Material Based on Nanotechnology (High-Thermal-Conductive Resin, Low-Dielectric-Loss Resin, Nanoparticles)", Hitachi Hyoron, Jul. 2005. Office Action in Japanese Patent Appln. 2005-307999, Mar. 2, 2010 (in Japanese) (3 pgs.). Office Action [Interrogation (Hearing)] in JP 2005-307999, dated May 6, 2011 (in Japanese, 3 pgs.); [English language translation, 2 pgs.].

* cited by examiner

*Primary Examiner* — Shawn Riley
(74) *Attorney, Agent, or Firm* — Antonelli, Terry, Stout & Kraus, LLP.

(57) ABSTRACT

A semiconductor device capable of reducing an inductance is provided. In the semiconductor device in which a rectification MOSFET, a commutation MOSFET, and a driving IC that drives these MOSFETs are mounted on one package, the rectification MOSFET, a metal plate, and the commutation MOSFET are laminated. A current of a main circuit flows from a back surface of the package to a front surface thereof. The metal plate is connected to an output terminal via a wiring in the package. Wire bondings are used for wirings for connecting the driving IC, the rectification MOSFET, and the commutation MOSFET, all terminals being placed on the same plane. For this reason, the inductance becomes small and also a power source loss and a spike voltage are reduced.

15 Claims, 17 Drawing Sheets

SEMICONDUCTOR DEVICE AND POWER SUPPLY DEVICE USING THE SAME

CROSS-REFERENCE TO RELATED APPLICATIONS

This application is a continuation of U.S. application Ser. No. 12/851,849, filed Aug. 6, 2010 now U.S. Pat. No. 8,067,979, which, in turn, is a continuation of U.S. application Ser. No. 12/349,106, filed Jan. 6, 2009 (now U.S. Pat. No. 7,782,025), which, in turn is a continuation of U.S. application Ser. No. 11/585,226, filed Oct. 24, 2006 (now U.S. Pat. No. 7,480,163) and which application claims priority from Japanese patent application No. JP 2005-307999 filed on Oct. 24, 2005, the entire contents of which are hereby incorporated by reference into this application.

BACKGROUND OF THE INVENTION

The present invention relates to a power supply device and, particularly, to a technology effectively applicable to a semiconductor device and a power supply device for use in electronic equipment or the like.

Conventionally, as a power supply device for use in electronic equipment or the like, a power supply device as shown in FIG. 2 is known. In the power supply device shown in FIG. 2, a direct-current power inputted to an input unit 51, which is configured to include an input capacitor 61, from a direct-current input power source 60 is switched by a switching unit 52 based on a control signal outputted from a driving unit 70. Power is supplied to a load 66 from an output unit 53 configured to include a commutation diode 63 and an output filter 55. Also, a voltage and current outputted to the load 66 are detected by a detecting unit 67. The detected value and a control target value of the load 66 set by a setting unit 68 are compared by a comparing operation unit 69. A control signal based on the comparison result is outputted from the driving unit 70 to the switching unit 52. In this manner, control is performed so that the power supplied to the load coincides with the control target value.

A specific circuit configuration of such a power supply device is shown in FIG. 3. The switching unit 52 includes an active element (for example, a transistor or a MOSFET or the like) 62. The output unit 53 is formed as an output filter including the commutation diode 63, a choke coil 64, and a capacitor 65. A control unit 54 includes the comparing operation unit 69, the setting unit 68, and the driving unit 70. Furthermore, the control unit 54 includes an oscillator circuit not shown and outputs a pulse signal from the driving unit 70 to the active element 62. For this reason, a direct-current voltage Vin from the direct-current input power source 60 to be applied to the active element 62 is switched.

In the power supply device shown in FIG. 3, when the active element 62 is in an ON state, the direct-current power is charged to the choke coil 64 and the capacitor 65 and is also supplied to the load 66. When the active element 62 is in an OFF state, energy charged in the choke coil 64 and the capacitor 65 is supplied via the commutation diode 63 to the load 66.

At this time, in the control unit 54, the comparing operation unit 69 monitors an output voltage Vo detected by the detecting unit 67 and compares the output voltage Vo with the control target value set by the setting unit 68, and the driving unit 70 then outputs a control signal based on the comparison result. For this reason, the ON or OFF state of the active element 62 is controlled so that the power supplied to the load coincides with the control target value. At this time, the output voltage Vo can be represented by the following Equation (1), $$Vo = Vin \times (Ton/T) \qquad (1),$$

where "Vin" is an input direct-current voltage, "T" is a cycle of a pulse signal outputted from the driving unit 70, and "Ton" is a conducting time of the active element 62 in a cycle T. That is, "Ton/T" represents a duty ratio.

Here, on a commutation side of the output unit 53, a diode, which is a passive element as shown in FIG. 3, is normally used. However, the commutation diode 63 has a current-voltage characteristic as shown in FIG. 4, wherein when the current reaches a predetermined value or higher, a forward voltage becomes in a saturated state. This saturated voltage is on the order of 0.9 V to 1.3 V for a high-speed diode and on the order of 0.45 V to 0.55 V for a Schottky diode. As such, when the forward voltage of the commutation diode 63 is saturated, a power loss occurs, thereby posing a problem of deteriorating power-source conversion efficiency. Moreover, since the power loss becomes large and junction temperature of an element rises, there is a problem in which as the output current is larger, it is required to increase the number of commutation diodes 63 (for example, to two or three) for parallel connection and distribute a power loss per element, thereby suppressing the junction temperature.

To solve this problem, as shown in FIG. 5, one synchronous-rectification-type power supply device, in which a commutation MOSFET 3 (diode 3A) is used on a commutation side, has been known. In FIG. 5, the reference numeral "1" denotes a direct-current input power source, "2" a rectification MOSFET (diode 2A), "4" a choke coil, "5" an output capacitor, "6" a resistor depicting an LSI as a load, "7" an input capacitor, and "9" a control circuit. This uses the fact that, as shown in FIG. 6, a current-voltage characteristic of the diode is non-linear, whilst a current-voltage characteristic of the MOSFET may be linear depending on the gate voltage and thus is smaller in voltage drop than the diode.

In such a power supply device, there are parasitic components resulting from a circuit configuration shown in FIG. 7. For example, these components are a parasitic resistance 10 of a main circuit, a parasitic inductance 11 of the main circuit, a parasitic resistance 12 of a MOSFET gate driving circuit, and a parasitic inductance 13 of the MOSFET gate driving circuit. FIG. 8 depicts a relation between the parasitic inductance 11 of the main circuit and a power source loss. It can be seen that as the inductance increases, the loss increases. Similarly also for the parasitic resistance 10 of the main circuit, the parasitic resistance 12 of the MOSFET gate driving circuit, and the parasitic inductance 13 of the MOSFET gate driving circuit, there is a tendency that as their numerical values increase, their losses increase.

As a means for reducing the parasitic inductance 11 of the main circuit, there is a scheme of mounting a plurality of semiconductor chips on one package. This scheme is called a Multi Chip Module (MCM) or System in Package (SiP). In recent years, as shown in FIG. 9, a module, in which a driving unit 15, a rectification MOSFET 2, a commutation MOSFET 3 are integrated as a function block 16, has been commercially available and is described in detail in Japanese Patent Laid-Open Publication No. 2004-342735 (Patent Document 1).

FIG. 10 is a drawing shown in above Patent Document 1, wherein a rectification MOSFET 20, a commutation MOSFET 21, and a driving IC 22 are integrated in a Quad FlatNo-Lead (QFN) package and wire bondings 23 are used for connection between chips and for connection between the chip and a lead frame 24. FIG. 11 is a section view of FIG. 10 (taken along line a-a').

SUMMARY OF THE INVENTION

However, in this semiconductor device, the wire bondings are used for a current route of the main circuit. Therefore, there is a problem of the inductance being large.

Accordingly, the present invention has been made to solve the above problem, and an object of the present invention is to provide a semiconductor device capable of reducing an inductance.

The above and other objects and novel features will become apparent from the description of the specification and the accompanying drawings.

Outlines of representative ones of the inventions disclosed in the present application will be briefly described as follows.

To achieve the above objects, the present invention is a semiconductor device, in which a rectification MOSFET, a commutation MOSFET, and a driving Integrated Circuit (IC) that drives these MOSFETs are mounted on one package, characterized in that the rectification MOSFET, a metal plate, and the commutation MOSFET are laminated; a current of a main circuit flows from a back surface of the package to a front surface thereof; the metal plate is connected to an output terminal via a wiring in the package; wire bondings as wirings for connecting the driving IC, the rectification MOSFET, and the commutation MOSFET are used to displace all terminals on the same plane.

Effects of representative ones of the inventions disclosed in the present application will briefly described as follows.

The present invention has the effect that the inductance of the main circuit of the semiconductor device is reduced and thereby a power source loss and a voltage spike can be reduced.

DESCRIPTION OF THE PREFERRED EMBODIMENTS

Figure 1:
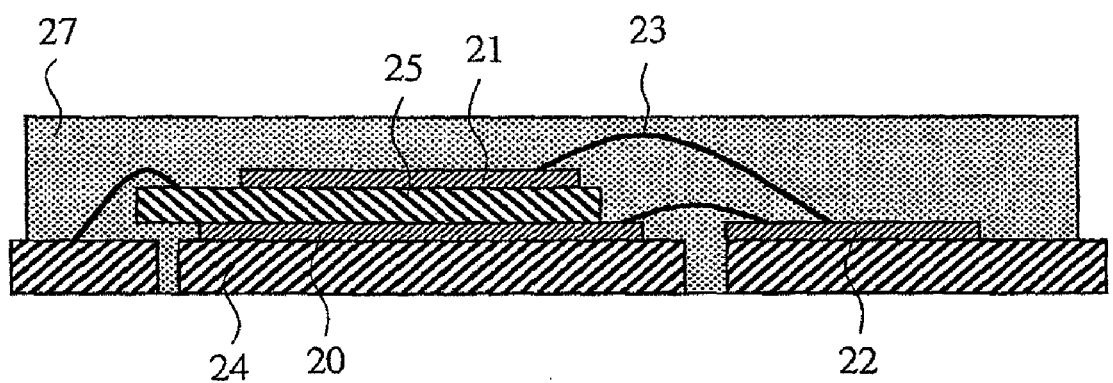
FIG. 1 is a section view showing a semiconductor device according to a first embodiment of the present invention.
Figure 2:
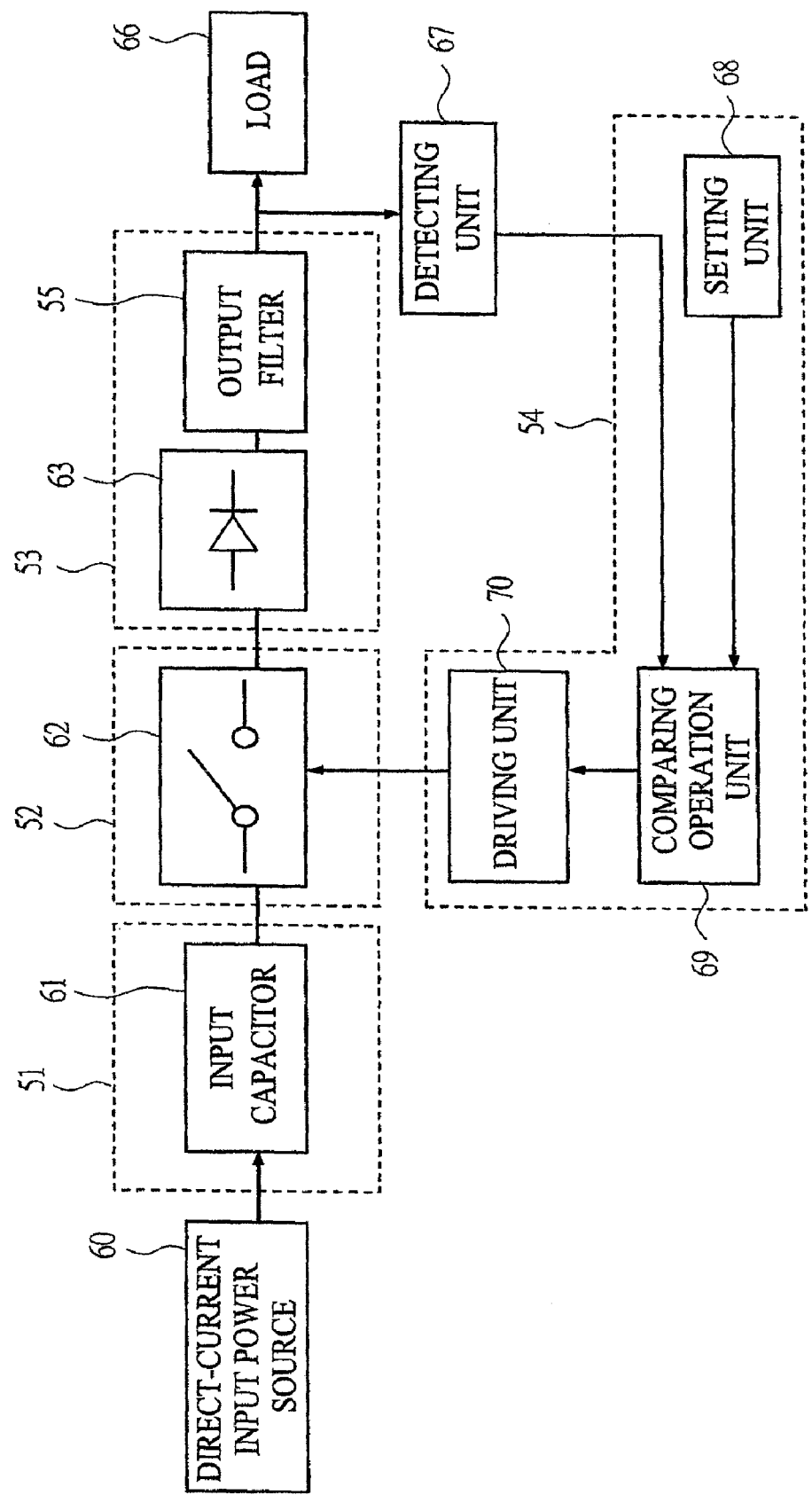
FIG. 2 is a block diagram for explaining a function of a conventional power supply device.
Figure 3:
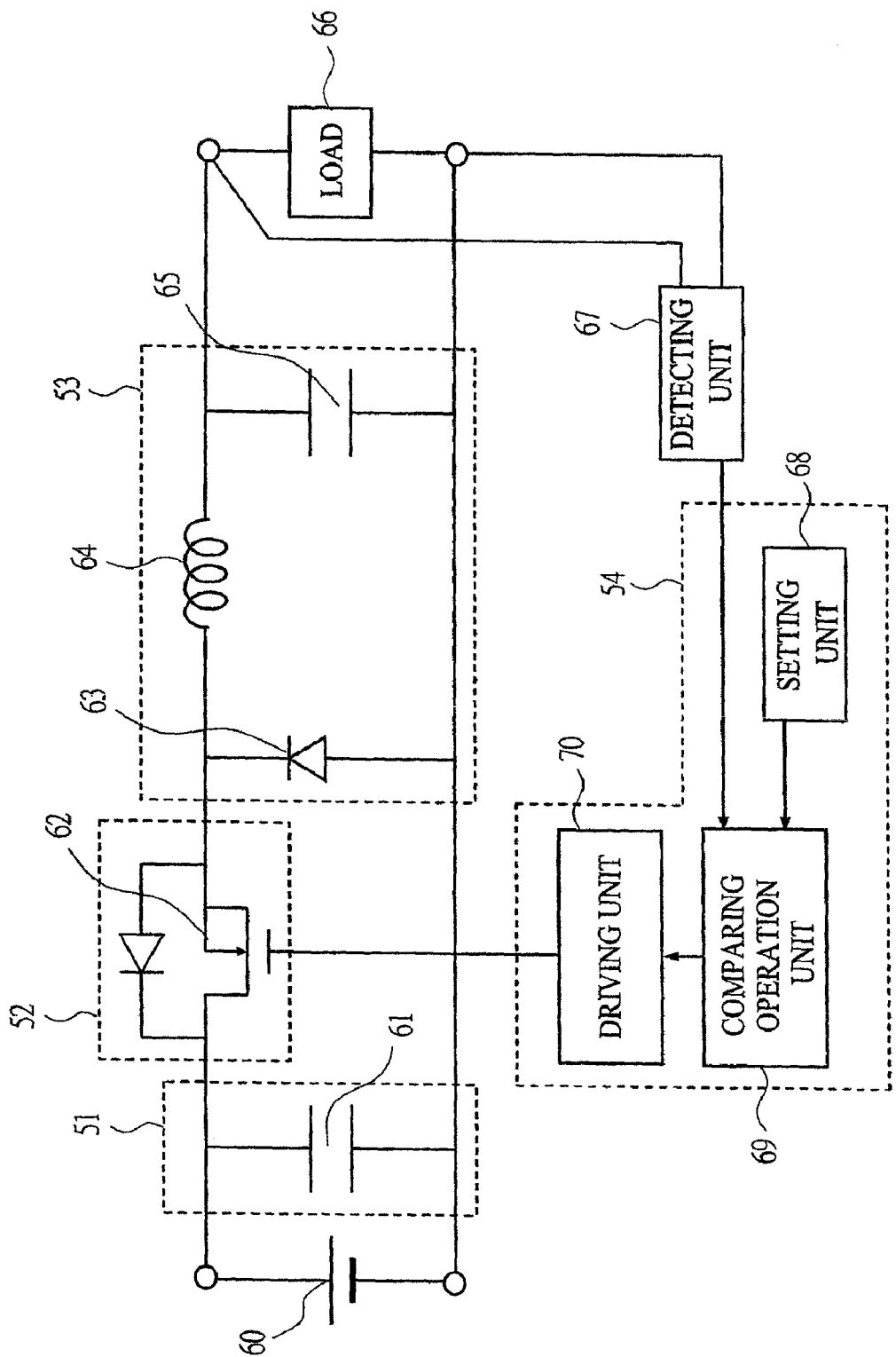
FIG. 3 is a block diagram for explaining a function and an electrical circuit of the conventional power supply device.
Figure 4:
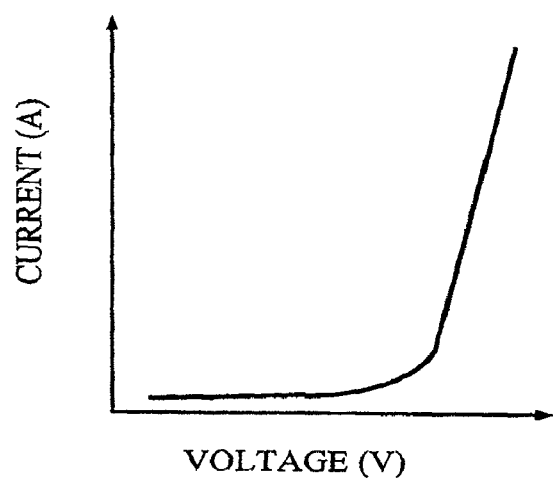
FIG. 4 is a view showing a relation between a voltage drop and a current of a diode.

Hereinafter, embodiments of the present invention will be detailed below with reference to the drawings. Note that, throughout all the drawings for describing the embodiments, the same members are denoted in principle by the same reference numerals and the repetitive explanation thereof will be omitted.

Also, in the drawings, for easy understanding, a plan view of a semiconductor device depicts a state in which although a top surface is actually covered with a sealing member, the sealing member is removed and components incorporated in the semiconductor device are exposed. Furthermore, a section view of a semiconductor device depicts a section taken along a line that is determined so as to be cut across main components.

Figure 5:
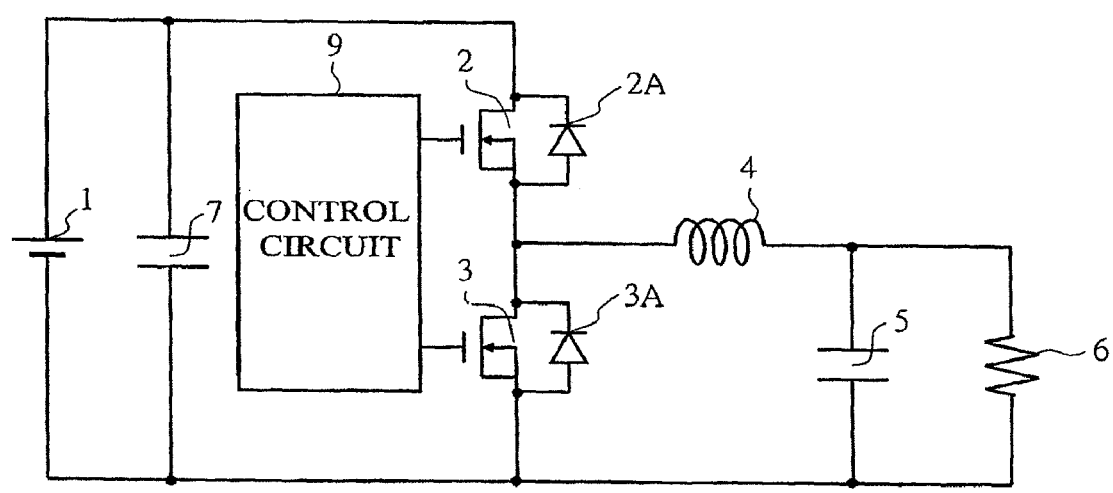
FIG. 5 is a view for explaining an electrical circuit of the conventional power supply device.
Figure 6:
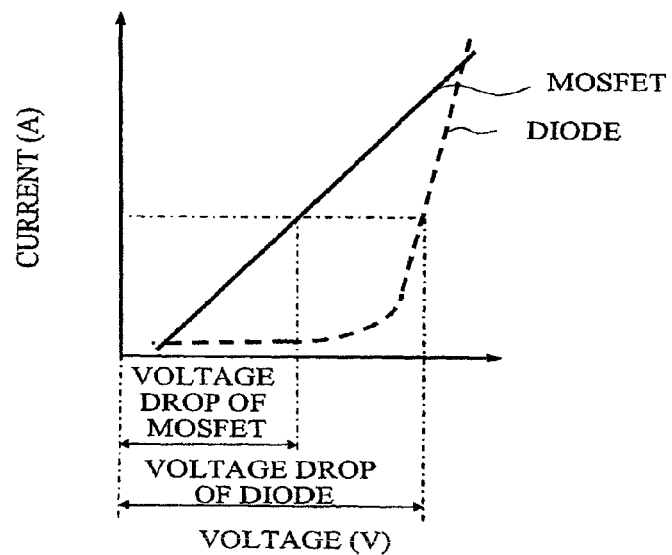
FIG. 6 is a view showing a relation between a voltage drop and current of each of a diode and a MOSFET.
Figure 7:
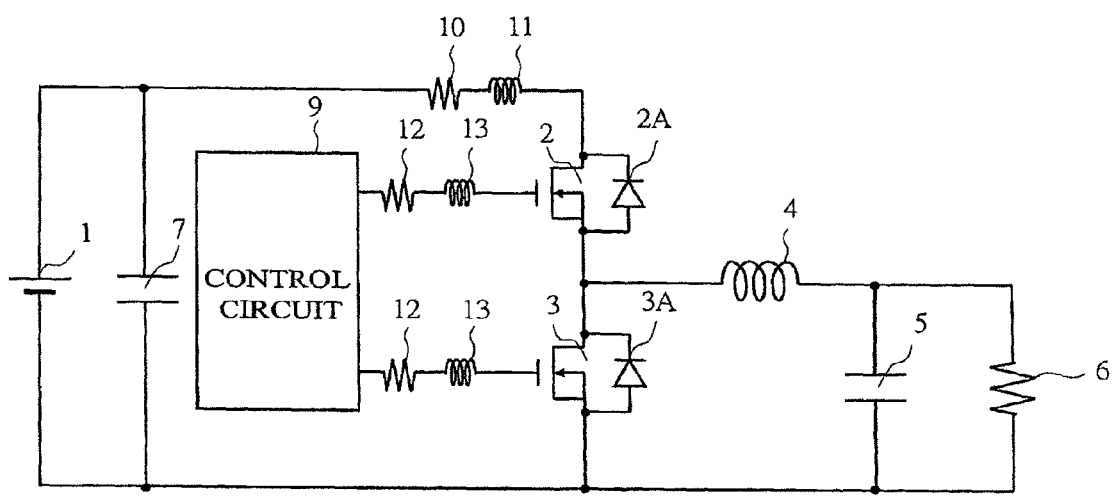
FIG. 7 is a view for explaining a parasitic inductance and a parasitic resistance in the power supply device.
Figure 8:
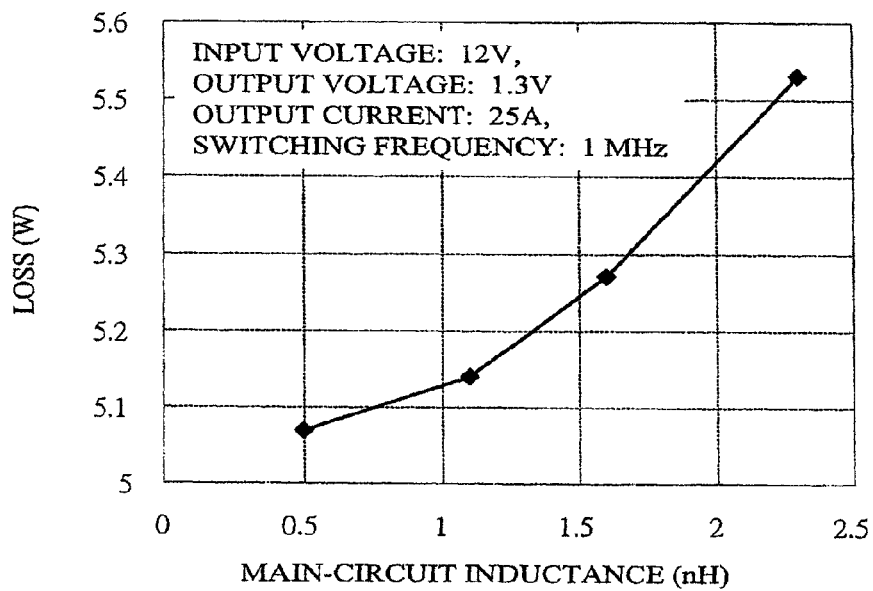
FIG. 8 is a view for depicting a relation between a main-circuit inductance and a power source loss.

The semiconductor device in the embodiments of the present invention is used for a synchronous-rectification-type power supply device as shown in FIG. 5 described above. That is, this power supply device is configured as follows. That is, one of main terminals of the rectification MOSFET is connected to a positive potential side of a direct-current input power source; the other of the main terminals of the rectification MOSFET is connected to one of terminals of a choke coil and one of main terminals of the commutation MOSFET; the other of the main terminals of the commutation MOSFET is connected to a negative potential side of the direct-current input power source; one of terminals of an output capacitor is connected to the other of the terminals of the choke coil; the other of the terminals of the output capacitor is connected to one of the main terminals of the commutation MOSFET; one of terminals supplying power to the semiconductor device serving as a load is connected to the other of the terminals of the choke coil; and the other of the terminals supplying the power to the semiconductor device serving as the load is connected to the other of the main terminals of the commutation MOSFET, wherein gates of the rectification MOSFET and the commutation MOSFET are driven by the control circuit.

In the following, the embodiments of the present invention will be individually described.

First Embodiment

Figure 12:
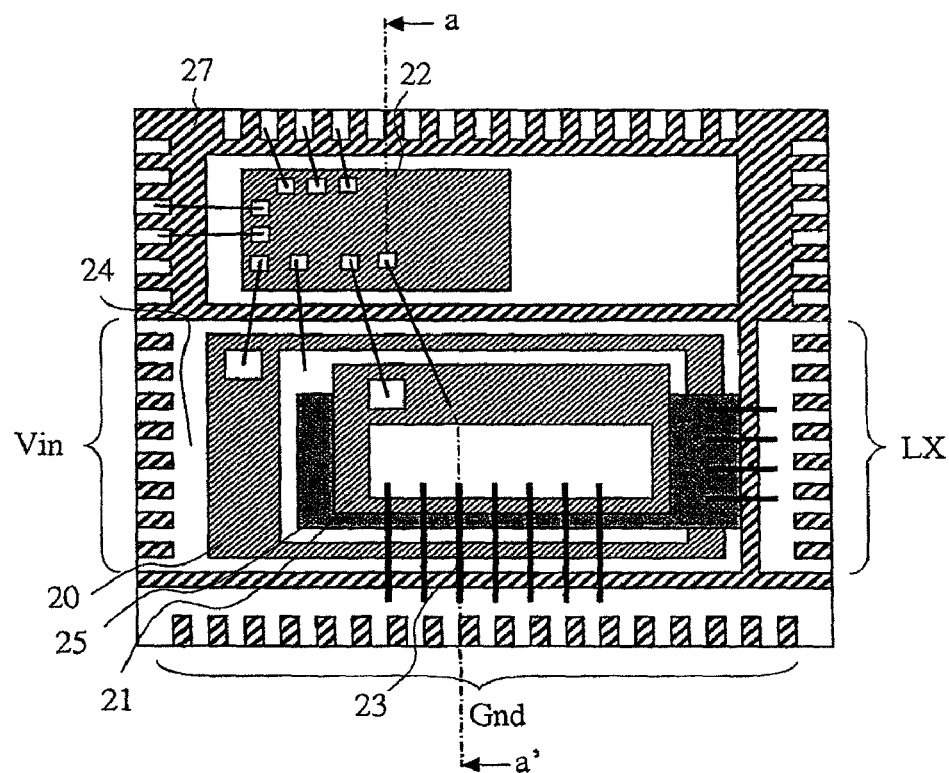
FIG. 12 is a plan view showing a semiconductor device according to a first embodiment of the present invention.

By using FIG. 12 and FIG. 1, a semiconductor device according to a first embodiment of the present invention is described. As shown in FIG. 12, the semiconductor device according to the present embodiment includes the rectification MOSFET 20, the commutation MOSFET 21, and the driving Integrated Circuit (IC) 22 that drives these MOSFETs. The rectification MOSFET 20, a metal plate (conductive member) 25, and the commutation MOSFET 21 are laminated. Through the wire bondings 23, the driving IC 22, the rectification MOSFET 20, and the commutation MOSFET 21 are connected. The rectification MOSFET 20 and a lead frame that leads to output terminals LX are connected to the metal plate through the wire bondings. The commutation MOSFET 21 and a lead frame that leads to ground terminals Gnd are connected through the wire bondings. The terminals of the main circuit and the terminals of the driving IC are placed on the same plane. This is because since the semiconductor device according to the present invention is mounted on an electrical circuit board, it is difficult to take out the terminals in a three-dimensional manner. FIG. 1 is a section view of FIG. 12 (taken along line a-a').

Figure 9:
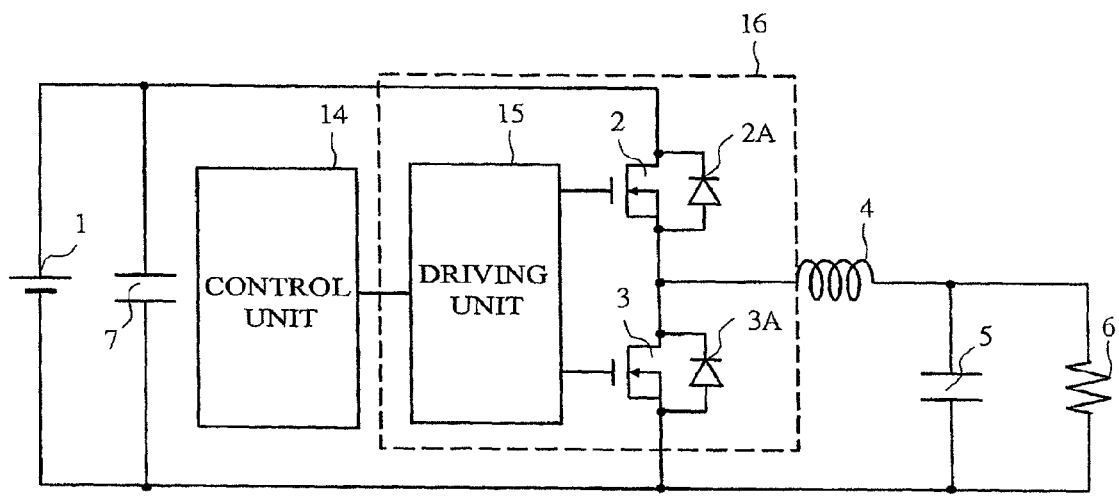
FIG. 9 is a view for explaining a function of a conventional semiconductor device.
Figure 10:
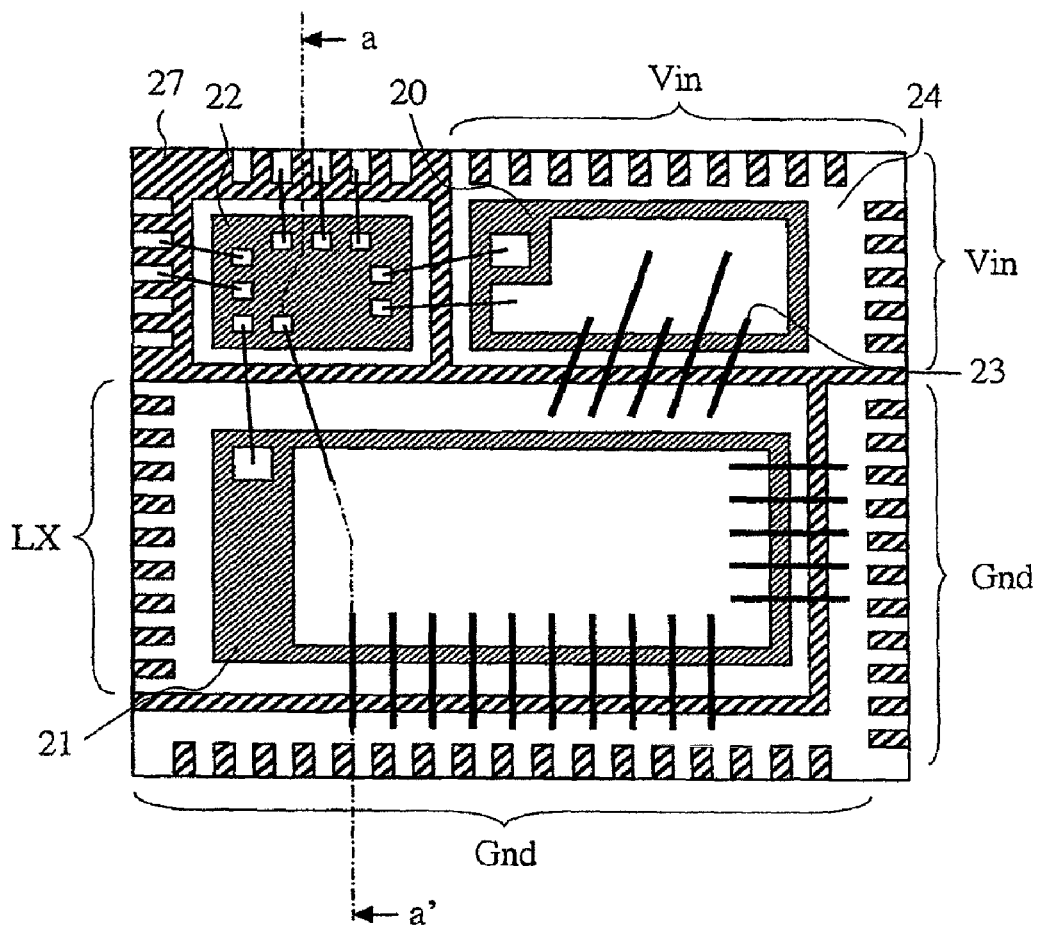
FIG. 10 is a plan view showing the conventional semiconductor device.
Figure 11:
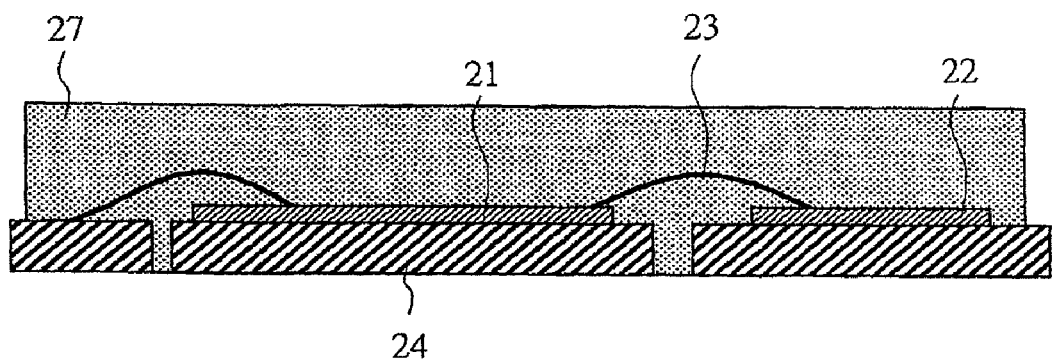
FIG. 11 is a section view showing the conventional semiconductor device.

Next, a current route of this semiconductor device is described. The current is classified into a main-circuit current and a gate current, and the main-circuit current is further divided into two periods, that is, a "power-supplying period" and a "commutation period". In the "power-supplying period", the rectification MOSFET 20 is in an ON state; the commutation MOSFET 21 is in an OFF state; and the current from the lead frame 24 which leads to the power source terminal Vin of FIG. 12 flows from a back surface of the rectification MOSFET 20 to a front surface thereof, passes through the metal plate 25, and then flows into the load via an output filter including the choke coil 4 and the output capacitor 5 of FIG. 9. On the other hand, in the "commutation period", the current passes through the metal plate 25 from the ground terminal Gnd, flows from a front surface of the commutation MOSFET 21 to a back surface thereof, and then flows into the choke coil 4 via the lead frame 24. In FIG. 12, for each of the rectification MOSFET 20 and the commutation MOSFET 21, a so-called "vertical device" in which a front surface side serves as a source and a back surface side serves as a drain is assumed.

Figure 13:
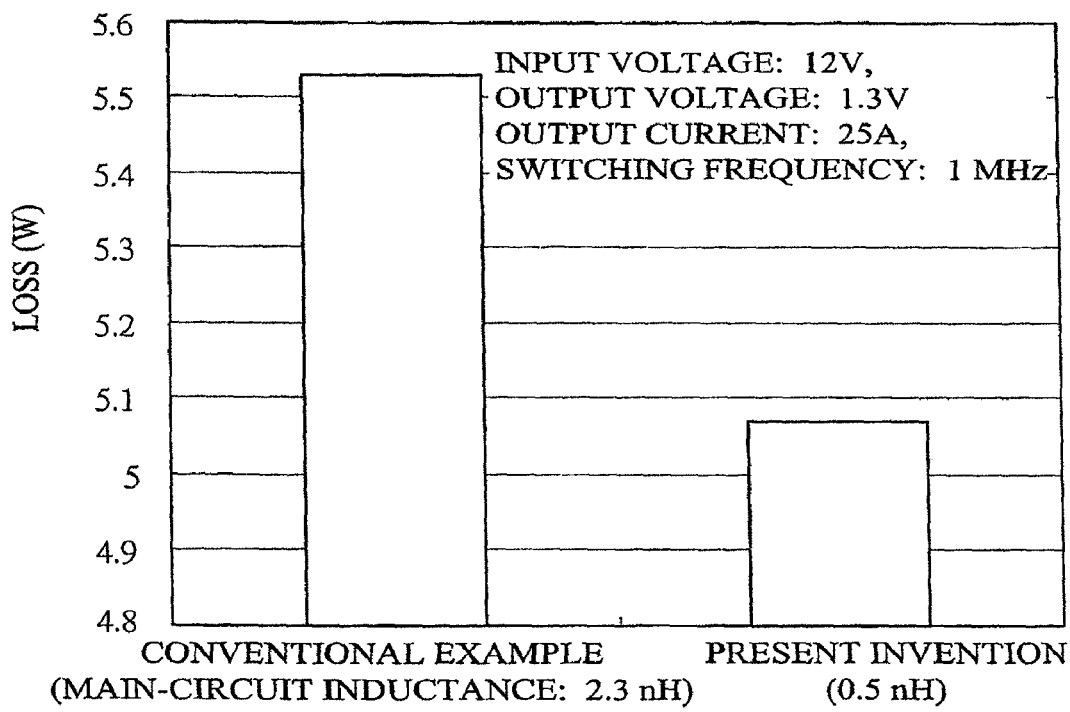
FIG. 13 is a view for explaining an effect of the present invention.

FIG. 13 depicts a comparison in power source loss between the present invention and a conventional example. The main circuit inductance in the conventional example is 2.3 nH while the inductance in the present invention can be reduced to 0.5 nH. Thus, the power source loss is improved from approximately 5.5 W to 5.1 W.

Second Embodiment

Figure 14:
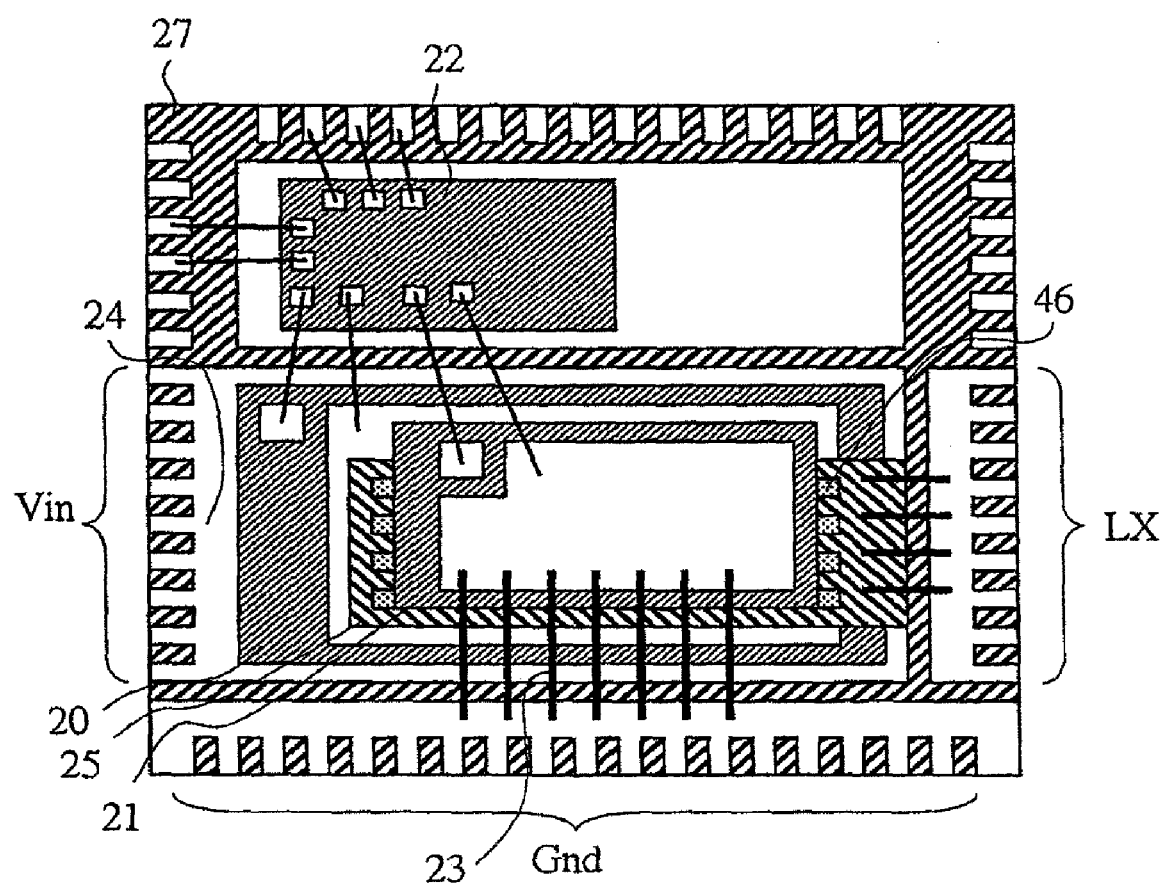
FIG. 14 is a plan view showing a semiconductor device according to another embodiment (second embodiment) of the present invention.

Next, an embodiment in which a stress of the metal plate 25 is mitigated is described. In a step of manufacturing the semiconductor device according to the present invention, a high-temperature process called a reflow is involved. At a time of performing the reflow, since a coefficient of thermal expansion of the semiconductor is different from that of the metal, there are problems of, for example, an occurrence of crack in a semiconductor chip. In the embodiment of FIG. 14, a plurality of trenches 46 are provided in the metal plate 25, thereby making it possible to mitigate the stress caused at the time of performing the reflow.

Third Embodiment

Next, another embodiment in which the inductance can be further reduced as compared with the first embodiment is described. In FIG. 12, the wire bondings are used for connections from the metal plate 25 to the lead frame 24 and from the commutation MOSFET 21 to the ground terminals. However, there is a problem in which the inductance of the wire bonding is larger than that of the metal plate.

Figure 15:
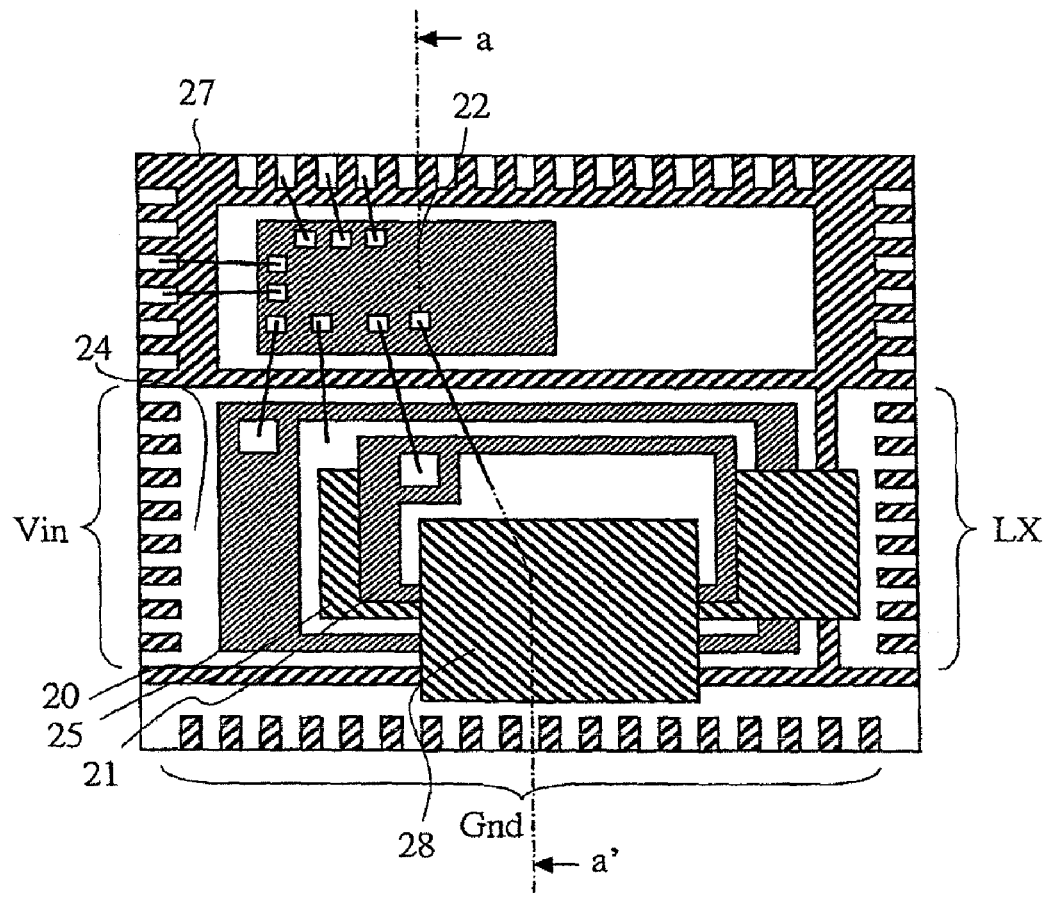
FIG. 15 is a plan view showing a semiconductor device according to another embodiment (third embodiment) of the present invention.
Figure 16:
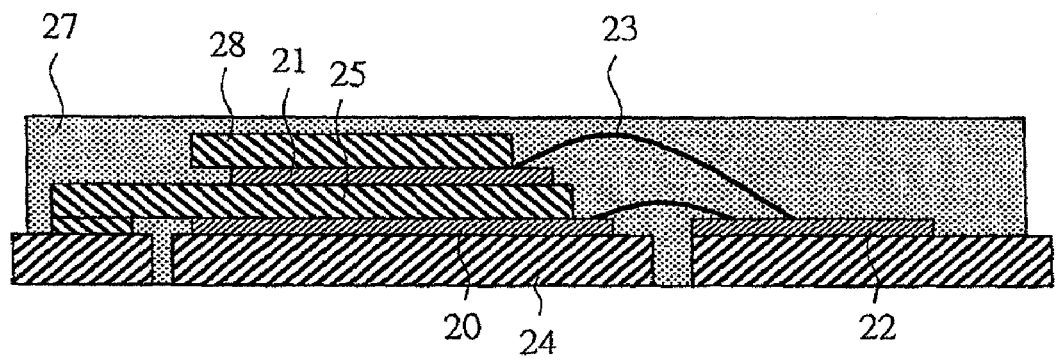
FIG. 16 is a section view showing the semiconductor device according to another embodiment (third embodiment) of the present invention.

FIG. 15 depicts an embodiment in which the metal plate 25 and a metal plate 28 are used for connections from the metal plate 25 to the lead frame 24 and from the commutation MOSFET 21 to the ground terminals, whereby as compared with the first embodiment, the inductance of the main circuit can be significantly reduced. FIG. 16 is a section view of FIG. 15 (taken along line a-a').

In the present embodiment, the metal plates are used for connections from the metal plate 25 to the lead frame 24 and from the commutation MOSFET 21 to the ground terminals. Alternatively, the metal plate may be used for one of the connections and the wire bonding(s) may be used for the other of the connections. Even in this case, needless to say, the characteristic can be improved as compared with the first embodiment.

Fourth Embodiment

Figure 17:
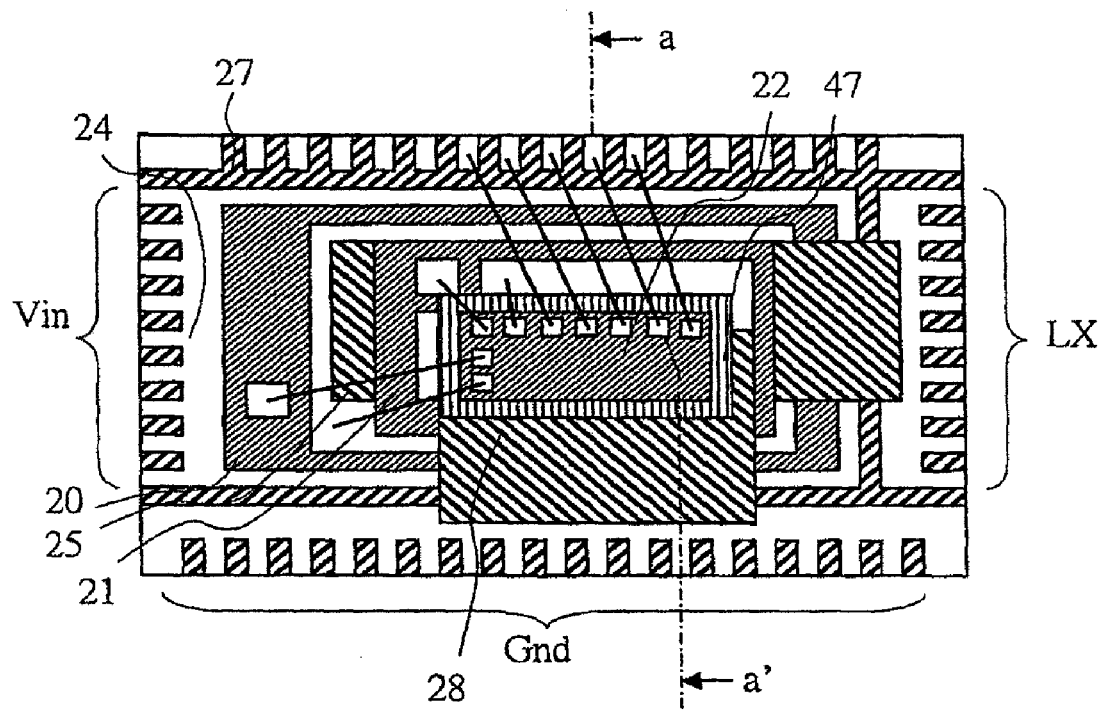
FIG. 17 is a plan view showing a semiconductor device according to another embodiment (fourth embodiment) of the present invention.
Figure 18:
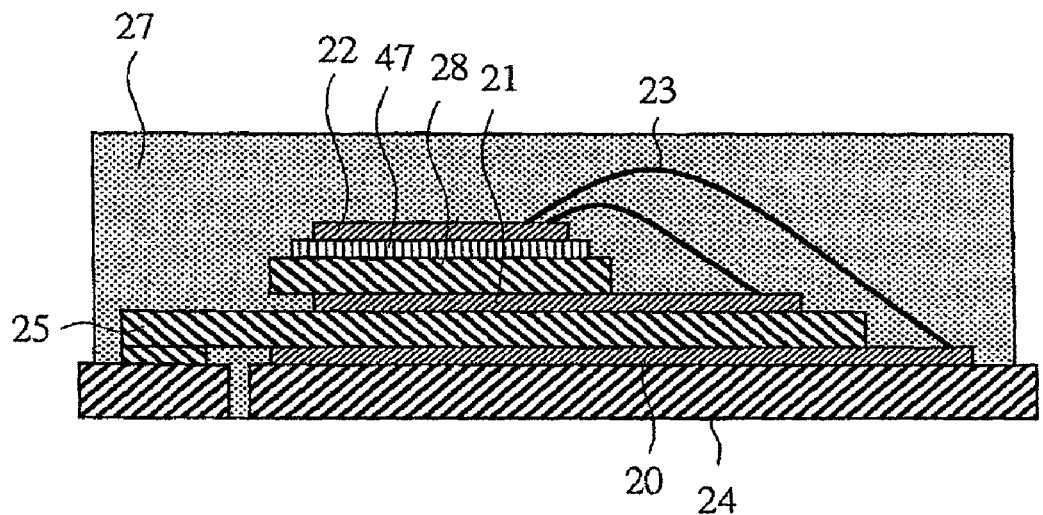
FIG. 18 is a section view showing the semiconductor device according to another embodiment (fourth embodiment) of the present invention.

Next, still another embodiment is described by using FIG. 17 and FIG. 18. The present embodiment is different from the embodiment of FIG. 15 in that the driving IC 22 is laminated via an insulator 47 on the commutation MOSFET 21 and the metal plate 28. By laminating the driving IC 22, distances from the driving IC 22 to the rectification MOSFET 20 and the commutation MOSFET 21 are shortened, so that the inductance of the driving circuit is reduced. There is also an effect of a mounting area being reduced. FIG. 18 is a section view of FIG. 17 (taken along line a-a').

Fifth Embodiment

Figure 19:
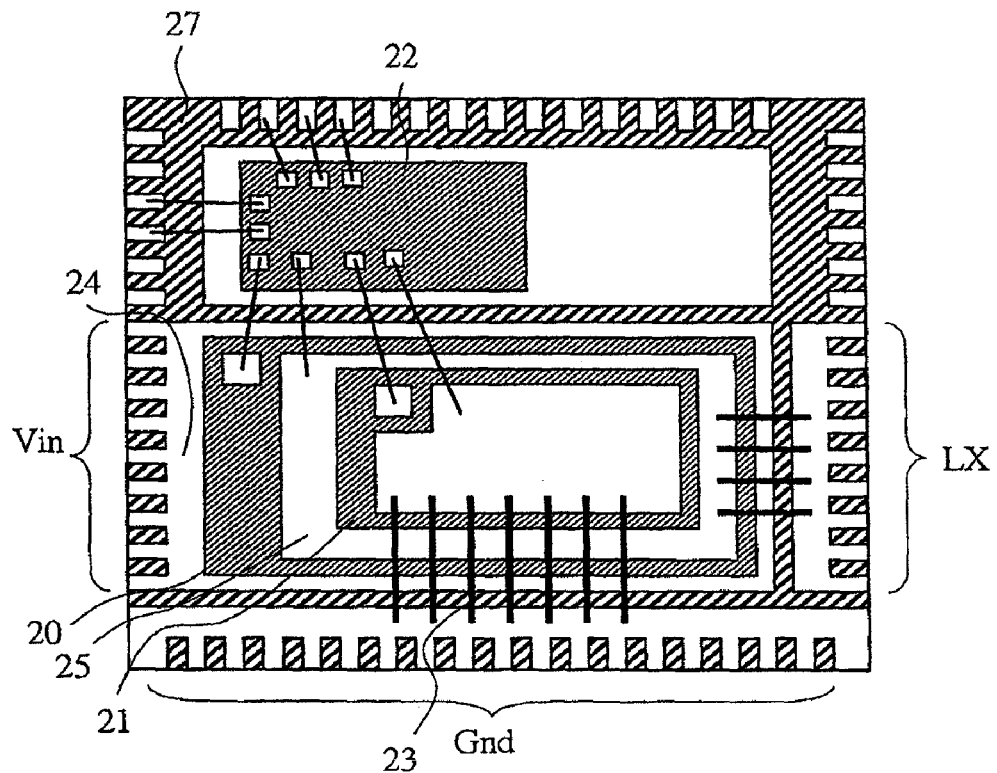
FIG. 19 is a plan view showing a semiconductor device according to another embodiment (fifth embodiment) of the present invention.

Next, still another embodiment is described by using FIG. 19. The present embodiment is different from the first embodiment only in that no metal plate is used. By using a wiring pattern(s) in a semiconductor pre-process in place of the metal plate, the spreading resistance of the wiring is increased, but an effect of simplifying a manufacturing process can be achieved.

Sixth Embodiment

Figure 20:
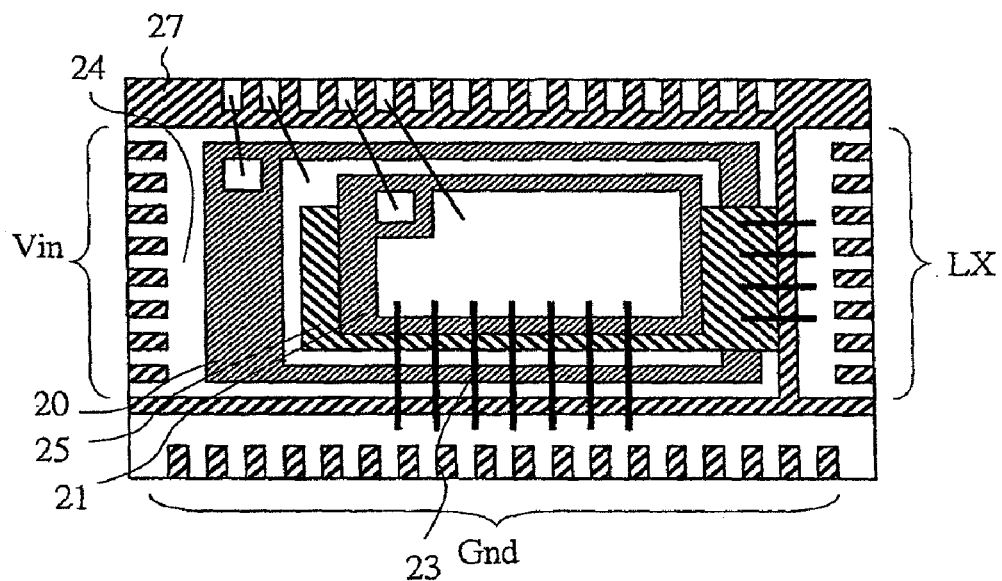
FIG. 20 is a plan view showing a semiconductor device according to another embodiment (sixth embodiment) of the present invention.

Next, still another embodiment is described by using FIG. 20. The present embodiment is different from the first embodiment in that no driving IC 22 is included. In the present embodiment, a driving IC has to be externally provided, but there is the advantage that a user of the semiconductor device can select an arbitrary driving IC.

Seventh Embodiment

Figure 21:
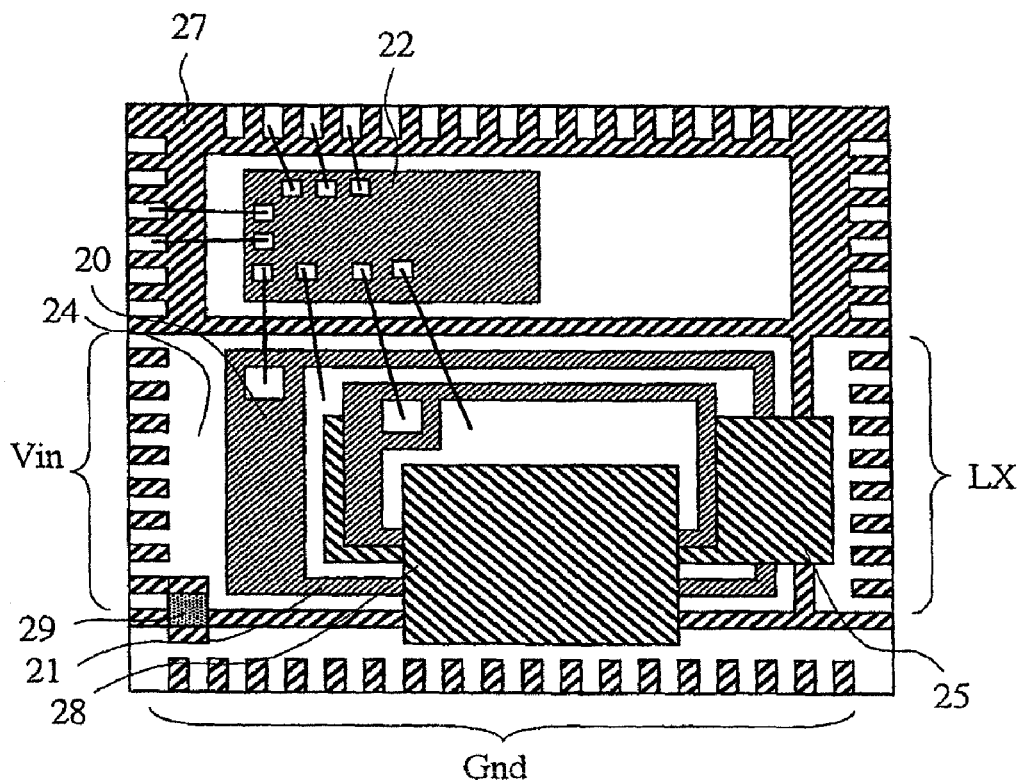
FIG. 21 is a plan view showing a semiconductor device according to another embodiment (seventh embodiment) of the present invention.

Next, still another embodiment is described by using FIG. 21. The embodiment of FIG. 21 is different from that of the first embodiment in that an input capacitor 29 is included in the semiconductor device. By incorporating the input capacitor therein, a distance of a main-circuit loop from the positive polarity of the input capacitor 29 through the rectification MOSFET 20 and the commutation MOSFET 21 back to the negative polarity of the input capacitor 29 becomes shortened, thereby making it possible to reduce the inductance.

Figure 22:
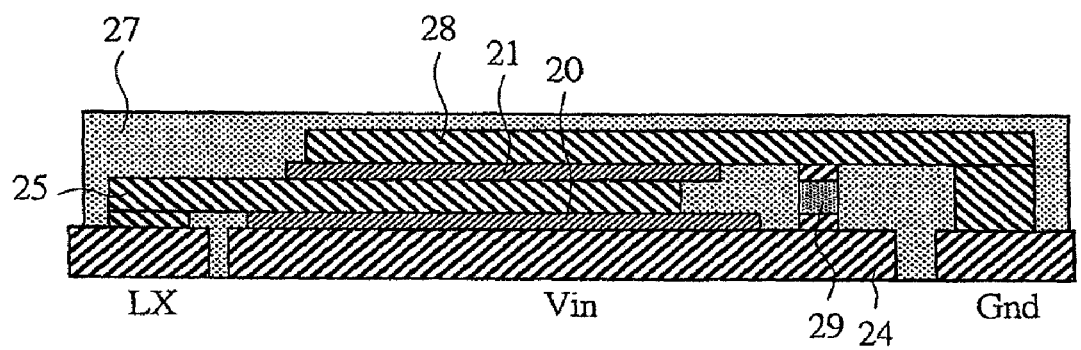
FIG. 22 is a section view showing the semiconductor device according to another embodiment (seventh embodiment) of the present invention.

FIG. 22 depicts an example in which the effect of reducing the inductance is further increased. The input capacitor 29 is placed between the lead frame 24 of the power source terminal and the metal plate 28 of the ground terminal. Thus, by placing the input capacitor 29 in a three-dimensional manner, the inductance of the above-described main-circuit loop can be minimized.

Eighth Embodiment

In recent years, with miniaturization in the semiconductor process, operating voltages of Large Scale Integrated Circuits (LSIs) serving as loads of power sources tend to be decreased. Under the condition that input voltage of the power source is not changed, the duty of the power source is decreasing year by year. In this case, the conductive period of the rectification MOSFET 20 is shortened, so that the rectification MOSFET 20 has a switching loss which is predominant as compared with a conductive loss. To reduce the switching loss, it is effective to decrease a feedback capacitance. With this, a chip size of the rectification MOSFET 20 is smaller than that of the commutation MOSFET 21. When the larger commutation MOSFET 21 is laminated on the rectification MOSFET 20 having a smaller area, a problem in mechanical strength arises in performing the wire bondings.

Figure 23:
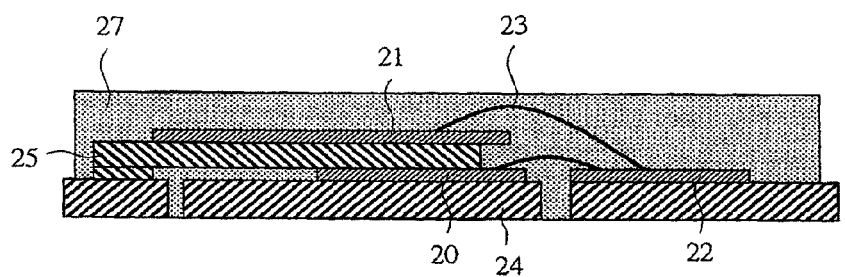
FIG. 23 is a section view showing a semiconductor device according to another embodiment (eighth embodiment) of the present invention.

An embodiment that addresses the above problem is next described. FIG. 23 has a feature in which the wire bondings 23 for use in connecting the driving IC 22 and the commutation MOSFET 21 are positioned at a place where the rectification MOSFET 20 and the metal plate 25 are laminated. With this configuration, it is possible to prevent the commutation MOSFET 21 from being tilted due to an impact at a time of bonding.

Figure 24:
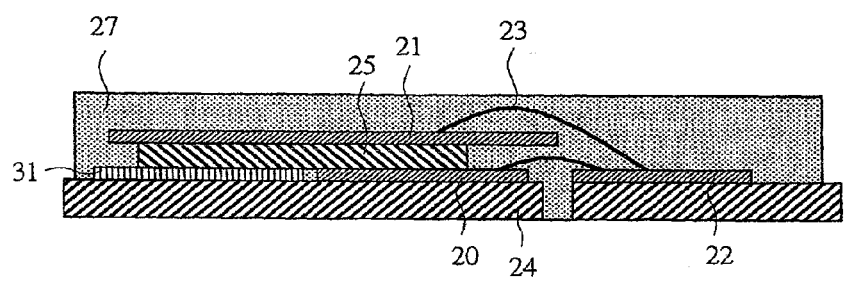
FIG. 24 is a section view showing the semiconductor device in another embodiment (eighth embodiment) of the present invention.

FIG. 24 is different from FIG. 23 in that a dummy chip 31 having the same thickness as that of the rectification MOSFET 20 is inserted. With this configuration, resistance to the impact caused at the time of bonding the rectification MOSFET 20 can be improved.

Ninth Embodiment

As described above, by laminating the semiconductor chips, there is the advantage that a mounting area becomes small and the device is miniaturized. By contrast, there is a problem of an increase in thermal resistance. In the following, two embodiments for solving this problem are described.

One of such embodiments is described by using FIG. 1. In the first embodiment, a resin is used as an example of a sealing member 27. However, there is a problem that, in general, a resin has large thermal resistance. Recently, a resin with a low thermal conductivity has been reported. By using such a resin with a high thermal conductivity for the sealing member 27 of FIG. 1, the thermal resistance of the package can be significantly reduced. Such a high-thermal-conductive resin is described in detail in Hitachi Hyoron, July, 2005, "New material based on nanotechnology (high-thermal-conductive resin, low-dielectric-loss resin, nanoparticles)".

Figure 30:
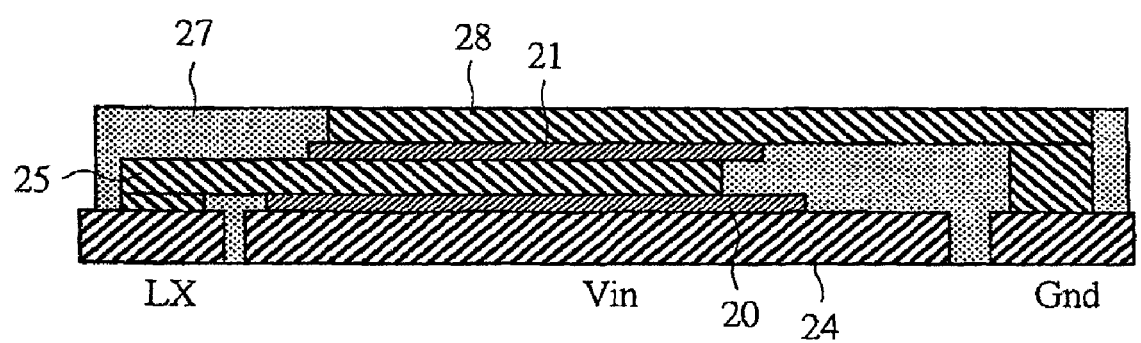
FIG. 30 is a section view showing a semiconductor device according to another embodiment (ninth embodiment) of the present invention.

The other of such embodiments is described by using FIG. 30. FIG. 30 is different from FIG. 1 in that the metal plate 28 is placed on the commutation MOSFET 21 and this metal plate 28 is exposed. By using the present embodiment, heat generated from the rectification MOSFET 20 and the commutation MOSFET 21 is released into an atmosphere via the metal plate 28, thereby significantly reducing thermal conductivity.

Tenth Embodiment

Figure 25:
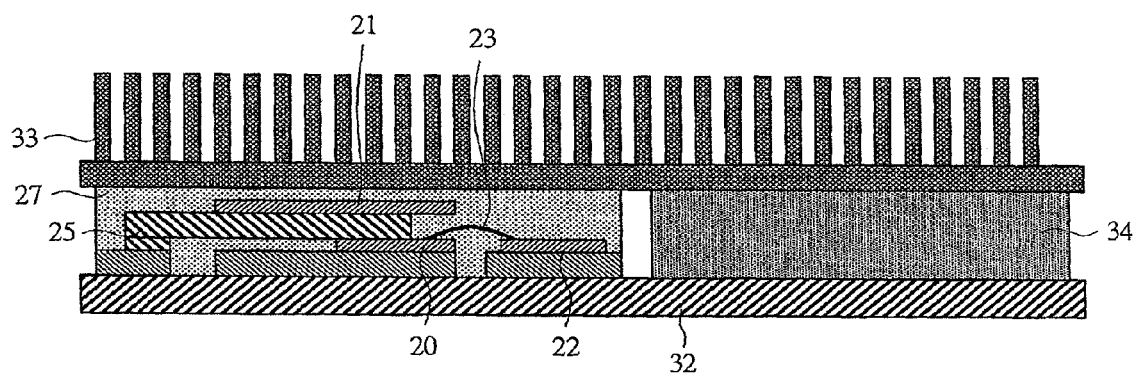
FIG. 25 is a section view showing an applied embodiment (tenth embodiment) of the semiconductor device of the present invention.

An embodiment including a Large Scaled Integrated Circuit (LSI) as a load is next described. FIG. 25 depicts a state where the semiconductor device according to the present invention and an LSI 34 as a load are mounted on an electrical circuit board 32 and heat sinks 33 common to these components are attached thereto. Since the heat sinks are made common, a heat sink(s) dedicated to the semiconductor device according to the present invention becomes unnecessary, whereby the number of components can be reduced. Also, since heat generated from the LSI is larger than that of the semiconductor device according to the present invention, the heat sink for the LSI does not have to be increased in size.

Eleventh Embodiment

An embodiment including the semiconductor device according to the present invention and an inductance and a capacitor which serves as an output filter, is described next. In the electric circuit of FIG. 5, the rectification MOSFET 2 and the commutation MOSFET 3 are alternately turned ON, and the outputted current and voltage have rectangular waves. Therefore, the output capacitor 5 and the choke coil 4 function to smooth the voltage and current.

Figure 26:
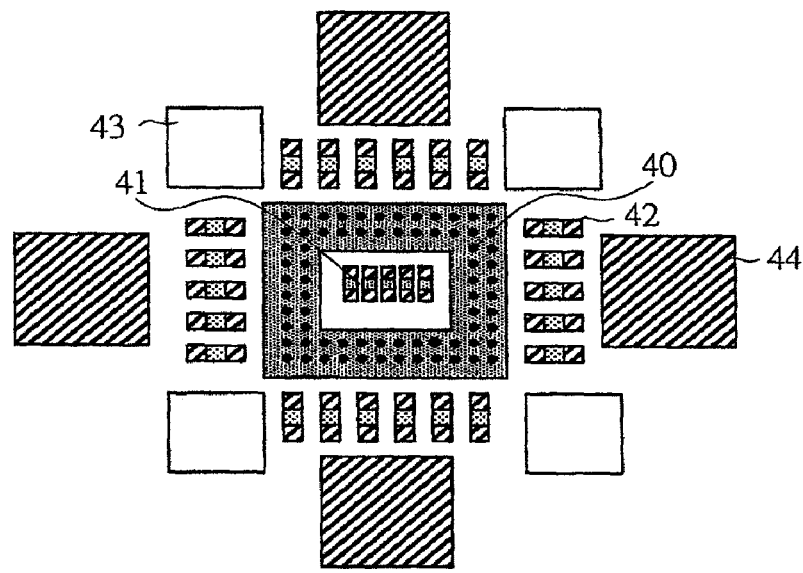
FIG. 26 is a plan view showing another applied embodiment (eleventh embodiment) of the semiconductor device of the present invention.

FIG. 26 depicts an embodiment including the semiconductor device according to the present embodiment, choke coils, capacitors, and a socket for an LSI serving as a load. A socket 40 is a socket for attaching the LSI, and is a Ball Grid Array (BGA) or a Land Grid Array (LGA). Near a center of the socket, capacitors 41 with excellent frequency characteristics are placed, and are surrounded by capacitors 42 with frequency characteristics inferior to those of the capacitors 41. The capacitors 42 are further surrounded by cock coils 43, which are surrounded by semiconductor devices 44 according to the present invention. In this manner, since the components forming the power source are densely arrayed, a distance between the output filter and the LSI serving as the load is shortened, thereby making it possible to reduce a change in voltages of the LSI at the time of switching of the rectification MOSFET.

Figure 27:
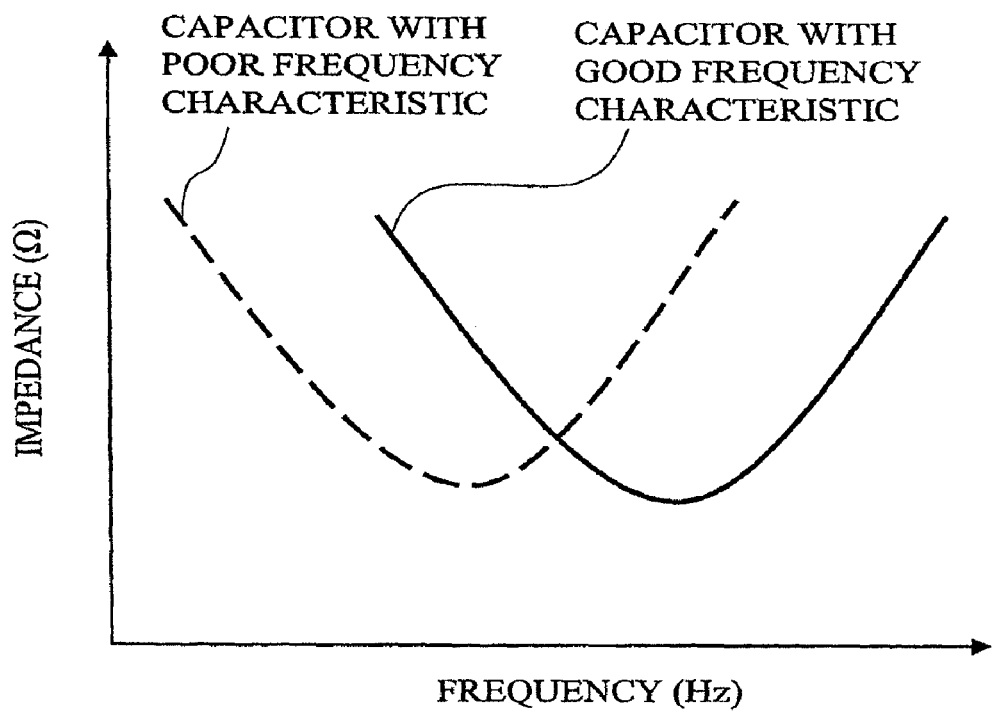
FIG. 27 is a view for explaining frequency characteristics of capacitors.

Here, frequency characteristics of capacitors are described. FIG. 27 depicts frequency characteristics of capacitors, wherein the horizontal axis represents frequency and the vertical axis represents impedance. The frequency of a capacitor forms a V-shape characteristic, and a reason for this is as follows. In a low frequency region, since the parasitic inductance of the capacitor is negligible, the impedance has a pure capacitance characteristic. By contrast, in a high frequency region, since a parasitic inductance becomes predominant, the impedance has an inductance characteristic. In the capacitor with a good frequency characteristic, the impedance is reduced up to high frequency. In the present embodiment, two capacitors having different frequency characteristics have been described as an example. Even if three or more capacitors having different frequency characteristics are used, a similar effect can be obtained.

Twelfth Embodiment

Figure 28:
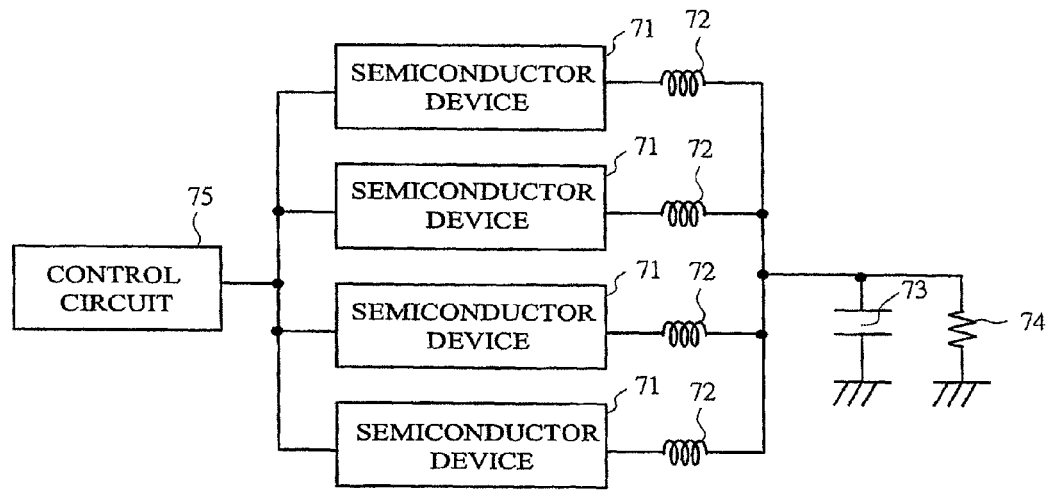
FIG. 28 is a view showing an electrical circuit of an applied embodiment (twelfth embodiment) of the semiconductor device of the present invention.

An applied embodiment of the semiconductor device according to the present invention is next described. FIG. 28 depicts an embodiment in which four semiconductor devices 71 according to the present invention are used in parallel. A control circuit 75 that outputs control signals with different phases to the respective semiconductor devices 71 is placed at the preceding stage of the semiconductor devices 71. In FIG. 28, the reference numeral "72" represents choke coils, "73" an output capacitor, and "74" a resistance representing an LSI serving as a load. In the present embodiment, since the number of semiconductor devices 71 in parallel is four, the phases of the signals outputted from the control circuit 75 differ by 90 degrees. By shifting the phases in this manner, effective switching frequency of the power source can be increased fourfold of each frequency, thereby making it possible to reduce ripples of the output current.

Thirteenth Embodiment

Figure 29:
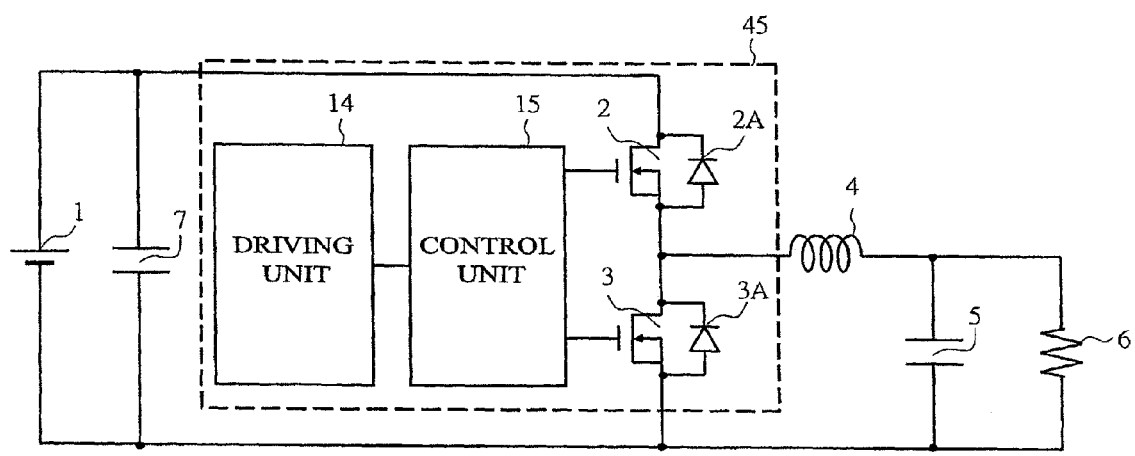
FIG. 29 is a view showing a function of an applied embodiment (thirteenth embodiment) of the semiconductor device of the present invention.

Next, still another embodiment is described. FIG. 29, which depicts the other embodiment, is different from FIG. 9 in that a control unit 14 is contained in the package. Therefore, since a region of a functional block 45 surrounded by a dotted line is mounted on one package, distances from the control unit 14 to the rectification MOSFET 2 and the commutation MOSFET 3 become shortened, so that delay of a signal from the control unit 14 is reduced and responsiveness to the case where the current of the LSI as a load is abruptly changed is improved.

In the foregoing, the invention made by the present inventors has been specifically described based on the embodiments. However, the present invention is not meant to be limited to the embodiments and, needless to say, can be variously modified within the scope of not departing from the gist thereof.

The present invention relates to a power supply device and, particularly, to a technology effectively applicable to a semiconductor device and a power supply device for use in electronic equipment.

What we claim is:

1. A semiconductor device formed on one package and including a rectification MOSFET, a commutation MOSFET, and a driver IC for driving the rectification MOSFET and the commutation MOSFET,
the semiconductor device comprising:
an input terminal (Vin);
an output terminal (Vout);
a ground terminal (Gnd);
a metal plate that laminates the rectification MOSFET and the commutation MOSFET;
a gate terminal of the rectification MOSFET;
a gate terminal of the commutation MOSFET; and
a terminal electrically connected to the output terminal (Vout), wherein
the gate terminal of the rectification MOSFET, the gate terminal of the commutation MOSFET, and the terminal electrically connected to the output terminal (Vout) are provided on the driver IC side of the semiconductor device.

2. The semiconductor device according to claim 1, wherein:
a wire from the gate terminal of the rectification MOSFET, a wire from the gate terminal of the commutation MOSFET, and a wire from the terminal electrically connected to the output terminal (Vout) are provided adjoiningly to each other.

3. The semiconductor device according to claim 1, wherein:
a voltage of the terminal electrically connected to the output terminal (Vout) has the same potential as that of a source electrode of the rectification MOSFET.

4. The semiconductor device according to claim 3, wherein:
a voltage of the terminal electrically connected to the output terminal (Vout) has the same potential as that of a drain electrode of the commutation MOSFET.

5. The semiconductor device according to claim 1, wherein:
the metal plate is arranged on the rectification MOSFET, and
the commutation MOSFET is arranged on the metal plate.

6. A semiconductor device formed on one package and including a rectification MOSFET, a commutation MOSFET, and a driver IC for driving the rectification MOSFET and the commutation MOSFET,
the semiconductor device comprising:
an input terminal (Vin);
an output terminal (Vout);
a ground terminal (Gnd);
a metal plate that laminates the rectification MOSFET and the commutation MOSFET;
a gate terminal of the rectification MOSFET;
a gate terminal of the commutation MOSFET; and
a terminal electrically connected to the output terminal (Vout), wherein
a wire from the gate terminal of the rectification MOSFET and a wire from the terminal electrically connected to the output terminal (Vout) are provided adjoiningly to each other.

7. The semiconductor device according to claim 6, wherein:
the gate terminal of the rectification MOSFET, the gate terminal of the commutation MOSFET, and the terminal electrically connected to the output terminal (Vout) are provided on the driver IC side of the semiconductor device.

8. The semiconductor device according to claim 6, wherein:
a voltage of the terminal electrically connected to the output terminal (Vout) has the same potential as that of a source electrode of the rectification MOSFET.

9. The semiconductor device according to claim 8, wherein:
a voltage of the terminal electrically connected to the output terminal (Vout) has the same potential as that of a drain electrode of the commutation MOSFET.

10. The semiconductor device according to claim 6, wherein:
the metal plate is arranged on the rectification MOSFET, and
the commutation MOSFET is arranged on the metal plate.

11. A semiconductor device formed on one package and including a rectification MOSFET, a commutation MOSFET, and a driver IC for driving the rectification MOSFET and the commutation MOSFET, the semiconductor device comprising:

an input terminal (Vin);

an output terminal (Vout);

a ground terminal (Gnd);

a metal plate that laminates the rectification MOSFET and the commutation MOSFET;

a gate terminal of the rectification MOSFET;

a gate terminal of the commutation MOSFET; and a terminal electrically connected to the output terminal (Vout), wherein a wire from the terminal electrically connected to the output terminal (Vout) is provided between a wire from the gate terminal of the rectification MOSFET and a wire from the gate terminal of the commutation MOSFET.

12. The semiconductor device according to claim 11, wherein:

the gate terminal of the rectification MOSFET, the gate terminal of the commutation MOSFET, and the terminal electrically connected to the output terminal (Vout) are provided on the driver IC side of the semiconductor device.

13. The semiconductor device according to claim 11, wherein:

a voltage of the terminal electrically connected to the output terminal (Vout) has the same potential as that of a source electrode of the rectification MOSFET.

14. The semiconductor device according to claim 13, wherein:

a voltage of the terminal electrically connected to the output terminal (Vout) has the same potential as that of a drain electrode of the commutation MOSFET.

15. The semiconductor device according to claim 11, wherein:

the metal plate is arranged on the rectification MOSFET, and the commutation MOSFET is arranged on the metal plate.

* * * * *